US007705631B2

(12) United States Patent
Chen

(10) Patent No.: US 7,705,631 B2
(45) Date of Patent: Apr. 27, 2010

(54) LEVEL SHIFTER CIRCUIT

(75) Inventor: Chung-Zen Chen, Hsinchu (TW)

(73) Assignee: Elite Semiconductor Memory Technology, Inc., Hsinchu (TW)

( * ) Notice: Subject to any disclaimer, the term of this patent is extended or adjusted under 35 U.S.C. 154(b) by 0 days.

(21) Appl. No.: 12/021,075

(22) Filed: Jan. 28, 2008

(65) Prior Publication Data

US 2009/0189638 A1    Jul. 30, 2009

(51) Int. Cl.
*H03K 19/0175* (2006.01)

(52) U.S. Cl. .............................. 326/81; 326/68; 326/83; 327/333

(58) Field of Classification Search .................... 326/62, 326/63, 68, 80–83, 86, 87; 327/333
See application file for complete search history.

(56) References Cited

U.S. PATENT DOCUMENTS 6,501,306 B1 *  12/2002  Kim et al. .................... 327/112
7,145,363 B2   12/2006  Kim
2005/0168241 A1  8/2005  Kim

* cited by examiner

*Primary Examiner*—Vibol Tan
*Assistant Examiner*—Jany Tran
(74) *Attorney, Agent, or Firm*—Hogan & Hartson LLP

(57) ABSTRACT

A level shifter comprises a voltage converting circuit, a voltage pull-up circuit, and a control signal generating circuit. The voltage converting circuit is configured to receive an input signal of a first voltage level and to output an output signal of a second voltage level. The voltage pull-up circuit is coupled to the voltage converting circuit and configured to expeditiously pull up a voltage of an output node of the level shifter to the second voltage level in response to a control signal. The control signal generating circuit is configured to receive the input signal and to provide the control signal to the voltage pull-up circuit. The control signal generating circuit includes three transistors.

14 Claims, 12 Drawing Sheets

US 7,705,631 B2

LEVEL SHIFTER CIRCUIT

BACKGROUND

1. Field of the Invention

The present invention relates to a semiconductor integrated circuit. More specifically, the present invention relates to a level shifter circuit that can switch voltage levels expeditiously.

2. Description of the Related Art

A semiconductor integrated circuit typically contains a large number of circuit units with different functions. These circuit units may operate on various voltage levels. To interface circuit units operating on different voltage levels, a level shifter circuit is used to receive an input signal of a first voltage level V1 and to produce an output signal of a second voltage level V2. FIGS. 1A and 1B illustrate two types of traditional level shifter circuits. Both types primarily comprise two PMOS transistors and two NMOS transistors but connect differently.

FIG. 1A shows the first type of a traditional level shifter circuit which comprises a first PMOS transistor P1, a second PMOS transistor P2, a first NMOS transistor N1, and a second NMOS transistor N2. The first PMOS transistor P1 is connected in series with the first NMOS transistor N1. The second PMOS transistor P2 is connected in series with the second NMOS transistor N2. The gate of the first PMOS transistor P1 is connected to the node B, the common node of the second PMOS transistor P2 and the second NMOS transistor N2. The gate of the second PMOS transistor P2 is connected to the node A, the common node of the first PMOS transistor P1 and the first NMOS transistor N1. The gate of the first NMOS transistor N1 is connected to a voltage, which is at the lower voltage level of V1 and V2, to turn on the first NMOS transistor N1. The source of the second NMOS transistor N2 is connected to a third voltage Vss, for example, the ground. An input signal of a first voltage level V1 (logic high) or third voltage level Vss (logic low) is provided to the drain of the first NMOS transistor N1 and the gate of the second NMOS transistor N2. The sources of the first PMOS transistor P1 and the second PMOS transistor P2 are connected to the power supply terminal of the second voltage level V2. An output signal of the second voltage level V2 (logic high) or the third voltage level Vss (logic low) is generated from the node B. The output signal is in the inversed state of the input signal. When the input signal is at logic high of the first voltage level V1, the output signal is at logic low of the third voltage level Vss, for example, the zero voltage. When the input signal is at logic low of the third voltage level Vss, for example, the zero voltage, the output signal is at logic high of the second voltage level V2.

Originally, the input signal is at logic high of the first voltage level V1 and the output signal is at logic low of the third voltage level Vss. When the input signal is switched to the logic low of the third voltage level Vss, the node A receives the third voltage Vss because the first NMOS transistor N1 is turned on. The third voltage Vss is also transmitted to the gate of the second NMOS transistor N2 to turn it off. However, the second PMOS transistor P2, upon its gate receiving the third voltage Vss, is turned on to gradually pull up the voltage of the node B to the second voltage level V2. After the voltage of node B is pulled up, the first PMOS transistor P1 is turned off and the voltage of the node A remains at the third voltage Vss. The output signal from the node B reaches the voltage level V2 with a time delay after the input signal is switched from the logic high to the logic low.

Similarly, when the input signal is switched from the logic low back to the logic high of the first voltage level V1, the node A receives the first voltage V1 because the first NMOS transistor N1 is turned on. The first voltage V1 is also transmitted to the gate of the second NMOS transistor N2 to turn it on. The voltage of the node B is gradually pulled down from the second voltage V2 to the third voltage Vss. After the voltage of the node B is pulled down, the first PMOS transistor P1 is turned on and the voltage of node A becomes at the second voltage V2. The output signal from the node B reaches the third voltage level Vss with a time delay after the input signal is switched from the logic low to the logic high.

In addition, at the moment the second NMOS transistor N2 is turned on by the input signal of the first voltage level V1, the second PMOS transistor P2 has not been completely turned off. As a result, a leakage current flows from the power supply terminal of the second voltage level V2 to the third voltage Vss terminal, for example, the ground.

FIG. 1B shows the second type of a traditional level shifter circuit which comprises a first PMOS transistor P1, a second PMOS transistor P2, a first NMOS transistor N1, a second NMOS transistor N2, and an inverter I1. The first PMOS transistor P1 is connected in series with the first NMOS transistor N1. The second PMOS transistor P2 is connected in series with the second NMOS transistor N2. The gate of the first PMOS transistor P1 is connected to the node B, the common node of the second PMOS transistor P2 and the second NMOS transistor N2. The gate of the second PMOS transistor P2 is connected to the node A, the common node of the first PMOS transistor P1 and the first NMOS transistor N1. The sources of the first NMOS transistor N1 and the second NMOS transistor N2 are connected to a third voltage level Vss, for example, the ground. An input signal of the first voltage level V1 is provided to the gate of the second NMOS transistor N2. The input signal of the first voltage level V1 is inversed through the inverter I1 and the inversed input signal is provided to the gate of the first NMOS transistor N1. The sources of the first PMOS transistor P1 and the second PMOS transistor P2 are connected to the power supply of the second voltage level V2. An output signal of the second voltage level V2 is generated from the node B. The output signal is in the inversed state of the input signal. When the input signal is at logic high of the first voltage level V1, the output signal is at logic low of the third voltage level Vss. When the input signal is at logic low of the third voltage level Vss, the output signal is at logic high of the second voltage level V2. The second type of the traditional level shifter circuit operates in a similar manner to the first type of the traditional level shifter circuit. Thus, it also causes problems of time delay for the output signal to reach the second voltage level V2 and the current leakage. FIG. 2 is the waveforms of the traditional level shifter circuits to show the time delay for the output signal to reach the second voltage level V2. After the input signal is switched from the logic high of the first voltage V1 to the logic low of the ground voltage, it takes more than 80 ns for the voltage of the output signal to reach the second voltage level V2.

FIGS. 3A and 3B show revised level shifter circuits which comprise one or two additional NMOS transistors to reduce the time delay and the leakage current. A third NMOS transistor N3 can be connected parallel to the second PMOS transistor P2 of either type of the traditional level shifter circuit to assist the pull-up of the voltage at the node B to reach the second voltage level V2. In addition, a fourth NMOS transistor N4 can be connected parallel to the first PMOS transistor P1 of either type of the traditional level shifter circuit to assist the pull-up of the voltage at the node A to reach the second voltage level V2.

As shown in FIG. 3A, the third NMOS transistor N3 in response to a control signal at the first voltage level V1 is added. The drain of the third NMOS transistor N3 is connected to the source of the second PMOS transistor P2. The source of the third NMOS transistor N3 is connected to the drain of the second PMOS transistor P2. The gate of the third NMOS transistor N3 is connected to receive the input signal of the first voltage level V1 through an inverter I2. When the input signal is switched from the logic high of the first voltage level V1 to the logic low of the third voltage level Vss, the third NMOS transistor N3, upon receiving the first voltage V1 through its gate, is turned on to assist the pull-up of the voltage at the node B to reach the voltage level V2 faster than the traditional level shifter circuit.

As shown in FIG. 3B, the third NMOS transistor N3 and the fourth NMOS transistors in response to control signals at the first voltage level V1 are added. The third NMOS transistor N3 is connected and operated in the same way as described above. The drain of the fourth NMOS transistor N4 is connected to the source of the first PMOS transistor P1. The source of the fourth NMOS transistor N4 is connected to the drain of the first PMOS transistor P1. The gate of the fourth NMOS transistor N4 is connected to receive the input signal of the first voltage level V1. When the input signal is switched from the logic low of the third voltage level Vss to the logic high of the first voltage level V1, the fourth NMOS transistor N4, upon receiving the first voltage V1 through its gate, is turned on to assist the pull-up of the voltage at the node A to reach the second voltage level V2 faster than the traditional level shifter circuit.

FIG. 4 is the waveforms of the revised level shifter circuits to show the time delay for the output signal to reach the voltage level V2. After the input signal is switched from the logic high of the first voltage V1 to the logic low of the ground voltage, it takes more than 20 ns for the voltage of the output signal to reach the second voltage V2.

The U.S. Pat. No. 7,145,363 describes a level shifter circuit similar to the revised level shifter circuits shown in FIGS. 3A and 3B. However, both the traditional and revised level shifter circuits are not satisfactory in resolving the problems of time delay and current leakage. For traditional level shifter circuits, because the second voltage V2 is high, the threshold voltage of the second PMOS transistor P2 has to be high enough to avoid the damage. As a result, the driving force of the second PMOS transistor P2 is weak and the time delay is very long. For revised level shifter circuits, because the voltage of the control signal for the third NMOS transistor is not high enough, its effect to reduce time delay is very limited. The industry desires level shifter circuits which can further reduce time delay and current leakage.

SUMMARY OF THE PREFERRED EMBODIMENTS

A level shifter comprises a voltage converting circuit, a voltage pull-up circuit, and a control signal generating circuit. The voltage converting circuit is configured to receive an input signal of a first voltage level and to output an output signal of a second voltage level. The voltage pull-up circuit is coupled to the voltage converting circuit and configured to expeditiously pull up a voltage of an output node of the level shifter to the second voltage level in response to a control signal. The control signal generating circuit is configured to receive the input signal and to provide the control signal to the voltage pull-up circuit. The control signal generating circuit includes three transistors.

A level shifter comprises a first-stage voltage converting circuit, a second-stage voltage converting circuit, and a voltage pull-up circuit. The first-stage voltage converting circuit is configured to receive an input signal of a first voltage level and to output a midway signal of an intermediate voltage level. The second-stage voltage converting circuit is configured to receive the midway signal and to output an output signal of a second voltage level. The voltage pull-up circuit is coupled to the second-stage voltage converting circuit and configured to expeditiously pull up a voltage of an output node of the level shifter to the second voltage level in response to a control signal with the intermediate voltage level.

BRIEF DESCRIPTION OF THE DRAWINGS

A more complete understanding of the present invention can be obtained by reference to the detailed description in conjunction with the accompanying drawings, which form part of the disclosure. These drawings depict only a typical embodiment of the invention and are not intended to limit its scope.

DETAILED DESCRIPTION OF THE PREFERRED EMBODIMENTS

An inventive level shifter circuit can substantially expedite the voltage switch of the output signal so as to significantly reduce the time delay and current leakage. The inventive level shifter circuit converts an input signal of a first voltage level V1 to an output signal of a second voltage level V2. The output signal is in the opposite logic-level of the input signal. Thus, when the input signal is switched from a logic high of the voltage V1 to a logic low of a third voltage Vss, the output signal is switched from a logic low of the third voltage Vss to a logic high of the second voltage V2 without substantial delay and current leakage. The inventive level shifter circuit has a control signal generating circuit to receive the input signal and to provide a control signal to an auxiliary pull-up transistor. To expeditiously pull up the voltage level at the output node, the voltage of the control signal may be higher than the first voltage level V1. The inventive level shifter circuit can be a one-stage voltage converting level shifter or a two-stage voltage converting level shifter. In one-stage voltage converting level shifter, the control signal can be generated by a control signal generating circuit. In two-stage voltage converting level shifter, the control signal can be generated by a first-stage voltage converting circuit.

Figure 1A:
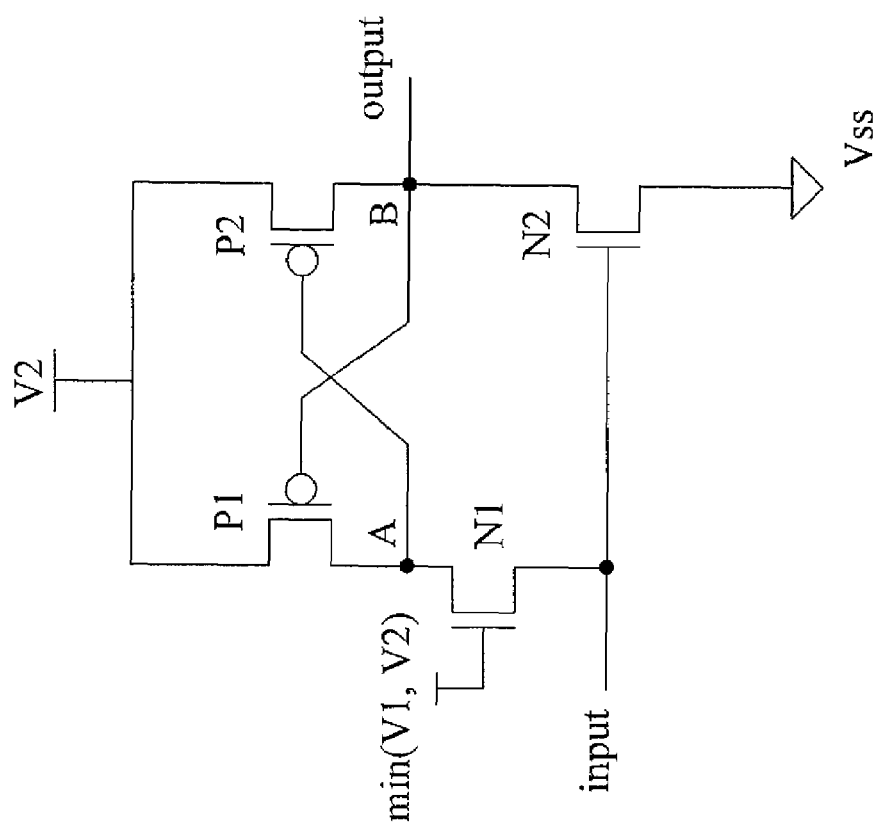
FIGS. 1A and 1B are schematic diagrams of traditional level shifter circuits.
Figure 1B:
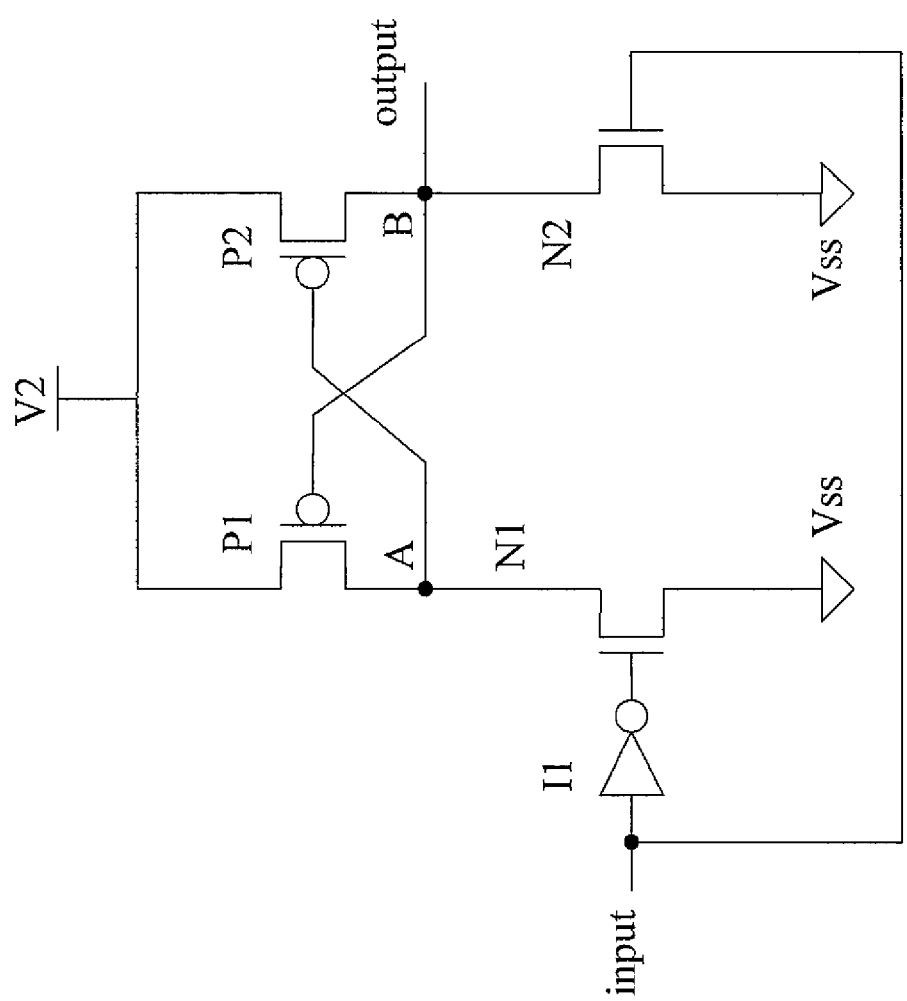
Figure 2:
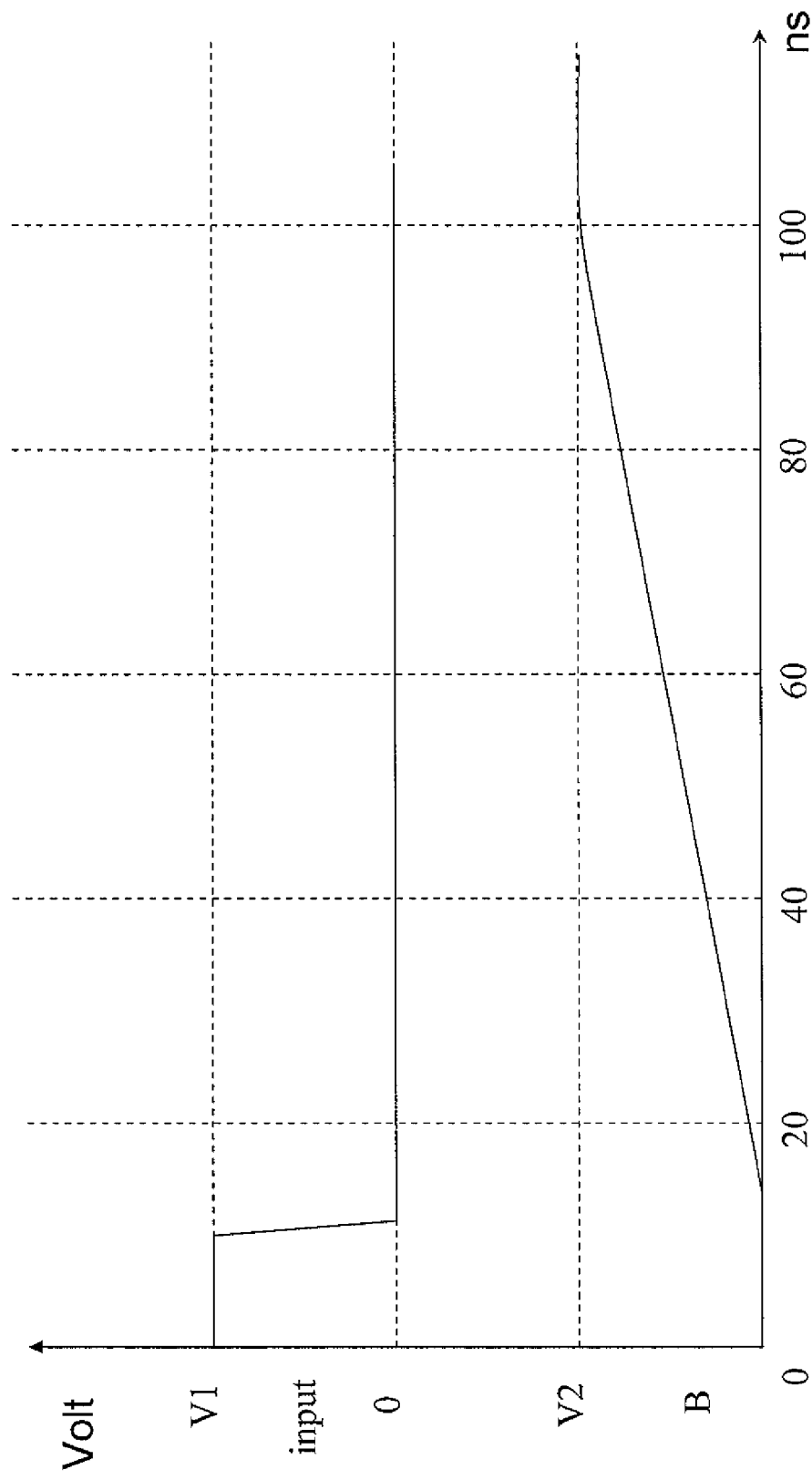
FIG. 2 is a waveform diagram of traditional level shifter circuits.
Figure 3A:
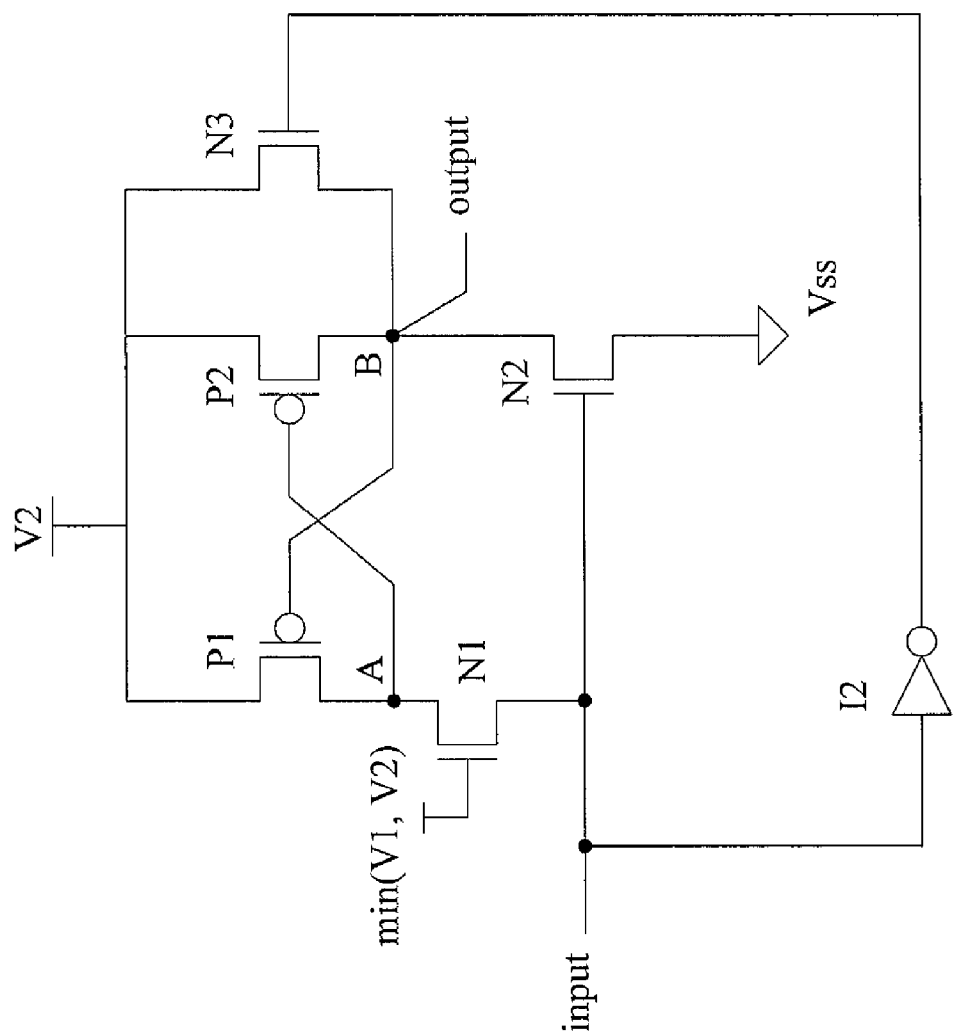
FIGS. 3A and 3B are schematic diagrams of revised level shifter circuits.
Figure 3B:
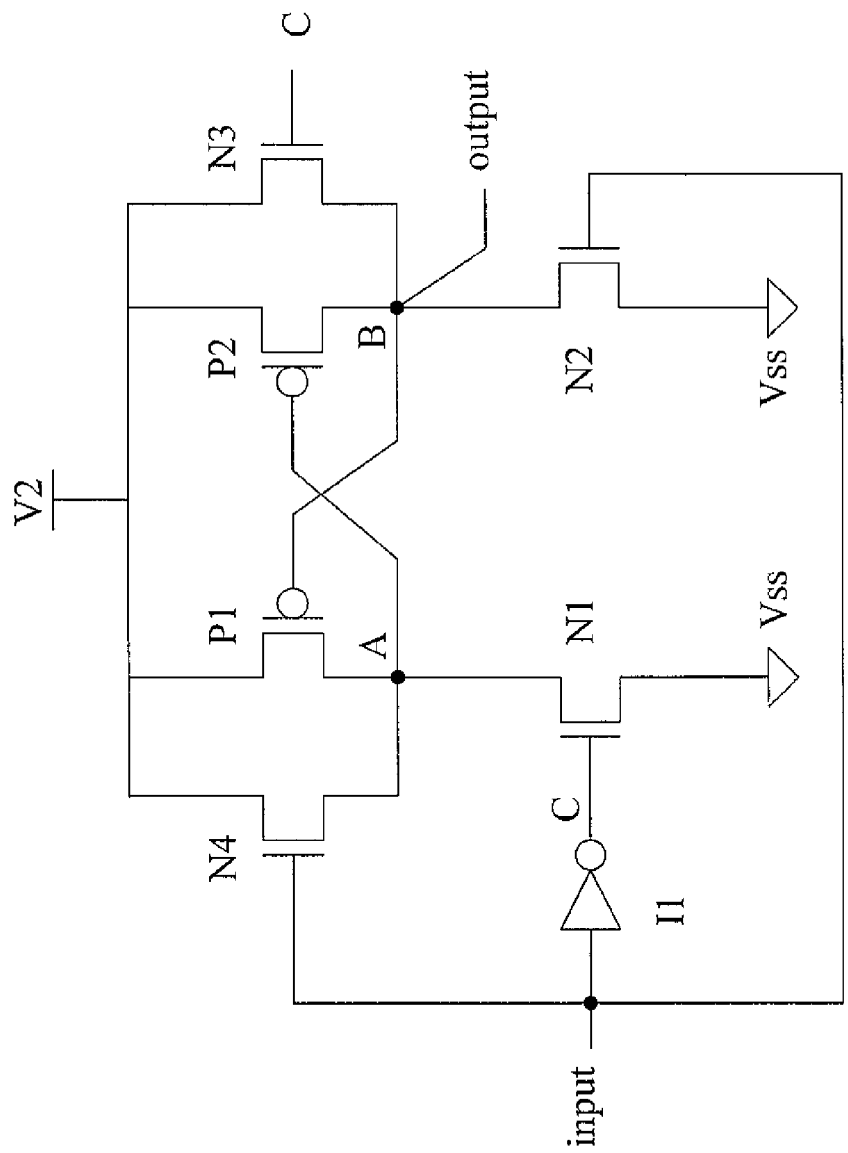
Figure 4:
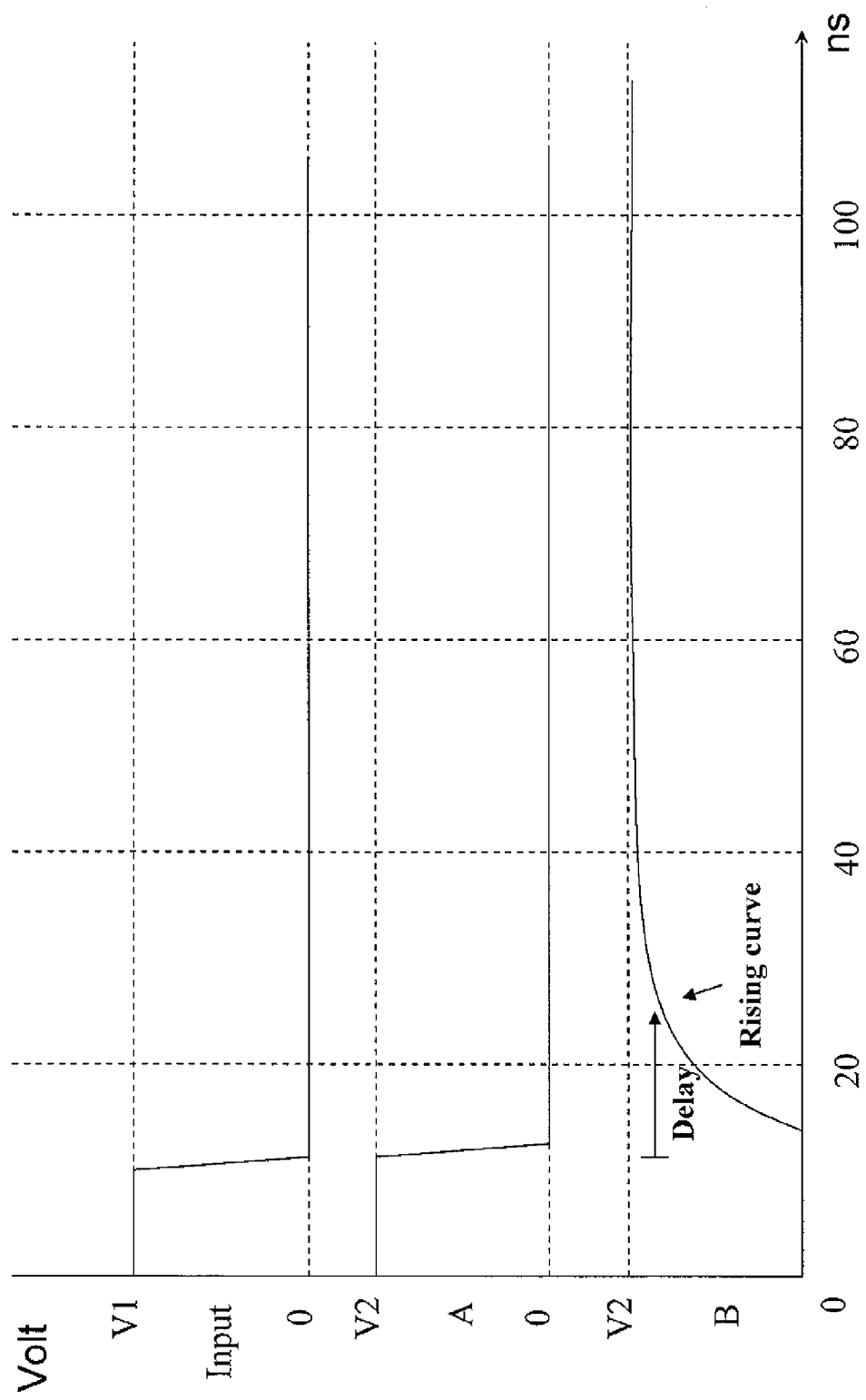
FIG. 4 is a waveform diagram of revised level shifter circuits.
Figure 5:
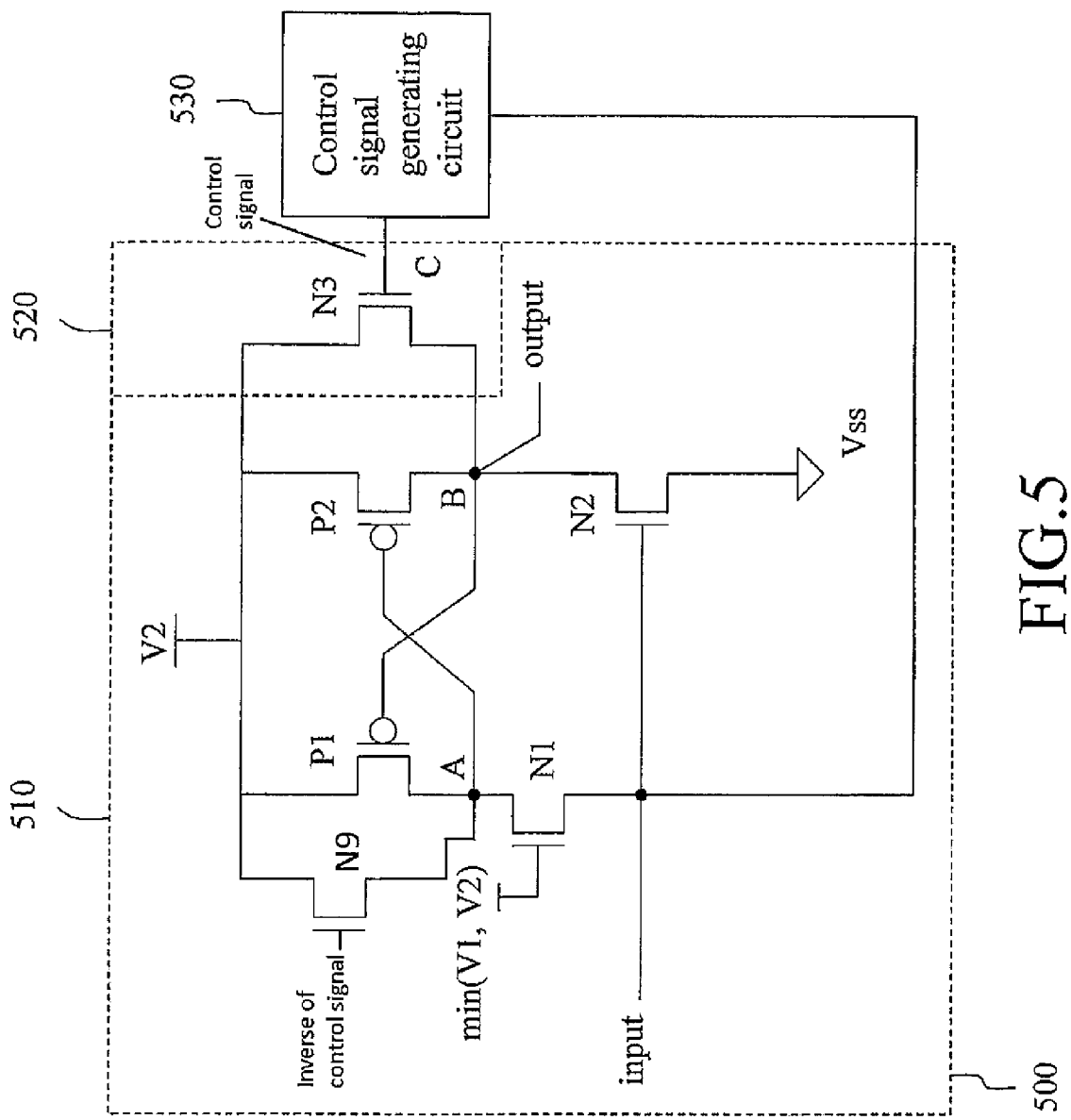
FIG. 5 is a schematic diagram of an embodiment of the inventive level shifter circuits.

FIG. 5 shows an embodiment of the inventive level shifter circuit 500 which comprises a voltage converting circuit 510 and a voltage pull-up circuit 520. The voltage converting circuit includes a first pull-up transistor, the first PMOS transistor P1; a second pull-up transistor, the second PMOS transistor P2; a first pull-down transistor, the first NMOS transistor N1; and a second pull-down transistor, the second NMOS transistor N2.

The first PMOS transistor P1 is connected in series with the first NMOS transistor N1 at the node A. The second PMOS transistor P2 is connected in series with the second NMOS transistor N2 at the node B. The gate of the first PMOS transistor P1 is connected to the node B. The gate of the second PMOS transistor P2 is connected to the node A. The sources of both the first PMOS transistor P1 and the second PMOS transistor P2 are connected to a power supply with a second voltage level V2. The gate of the first NMOS transistor N1 is connected to the lower one of the first voltage V1 and the second voltage V2 to constantly to turn on the first NMOS transistor N1. The source of the second NMOS transistor N2 is connected to a power supply of the third voltage level Vss. The third voltage level Vss can be the ground, 0V. An input signal of the first voltage level V1 or the third voltage level Vss is provided to the drain of the first NMOS transistor N1 and the gate of the second NMOS transistor N2. An output signal of the second voltage level V2 or the third voltage level Vss is generated from the node B, the common node of the second PMOS transistor P2 and the second NMOS transistor N2. The output signal is in the opposite logic-level of the input signal. When the input signal is at the logic high of the first voltage V1, the output signal is at the logic low of the third voltage Vss. When the output signal is at the logic low of the third voltage Vss, the output signal is at the logic high of the second voltage V2. Skilled artisans know how to add an inverter to make the output signal in the same logic-level as the input signal, when necessary.

If the input signal is originally at the logic high of the first voltage V1, the output signal is at the logic low of the third voltage Vss. When the input signal is switched to the logic low of the third voltage Vss, the node A receives the third voltage Vss because the first NMOS transistor N1 is turned on. The third voltage Vss is also transmitted to the gate of the second NMOS transistor N2 to turn it off. In addition, the second PMOS transistor P2, upon its gate receiving the third voltage Vss, is turned on to pull up the voltage of the node B to the second voltage level V2. After the voltage of the node B is pulled up, the first PMOS transistor P1 is turned off and the voltage of the node A remains at the third voltage Vss.

Similarly, when the input signal is switched to the logic high of the first voltage V1, the node A receives the first voltage V1 because the first NMOS transistor N1 is turned on. The Voltage V1 is also transmitted to the gate of the second NMOS transistor N2 to turn it on. The voltage of the node B is pulled down from the second voltage V2 to the third voltage Vss. In addition, the second PMOS transistor P2, upon its gate receiving the voltage V1, is turned off. After the voltage of the node B is pulled down, the first PMOS transistor P1 is turned on and the voltage of the node A is pulled up to the voltage V2.

In another embodiment (not shown), the voltage converting circuit 510 can further include a first inverter I1 and the NMOS transistors N1 and N2 are connected differently to perform the voltage conversion. The sources of both the first NMOS transistor N1 and the second NMOS transistor N2 are connected to a power supply of the third voltage level Vss. The input signal is provided to the gate of the second NMOS transistor N2. After the inverter I1 inverses the input signal, the inversed input signal is provided to the gate of the first NMOS transistor N1.

As shown in FIG. 5, the voltage pull-up circuit 520 has a first auxiliary pull-up transistor, the third NMOS transistor N3. The drain of the third NMOS transistor N3 is connected to the power supply of the second voltage level V2 and the source of the second PMOS transistor P2. The source of the third NMOS transistor N3 is connected to the node B and the drain of the second PMOS transistor P2. The gate of the third NMOS transistor N3 receives a first control signal with the voltage level Vcs1. The voltage Vcs1 is higher than the first voltage level V1 and in the opposite logic-level of the input signal. The higher voltage level Vcs1 can quickly turn on the third NMOS transistor N3 to expeditiously pull up the voltage of the node B to the second voltage V2. As a result, the time delay and current leakage can be substantially reduced.

In another embodiment (not shown), the voltage pull-up circuit 520 can further include a second auxiliary pull-up transistor, the fourth NMOS transistor N4. The drain of the fourth NMOS transistor N4 is connected to the power supply of the second voltage level V2 and the source of the first PMOS transistor P1. The source of the fourth NMOS transistor N4 is connected to the node A and the drain of the first PMOS transistor P1. The gate of the fourth NMOS transistor N4 receives a second control signal with the voltage level Vcs2. The voltage Vcs2 is higher than the first voltage level V1 and in the same logic-level of the input signal. The higher voltage level Vcs2 can quickly turn on the fourth NMOS transistor N4 to expeditiously pull up the voltage of the node A to the second voltage V2. As a result, the time delay and current leakage can be substantially reduced.

Figure 6:
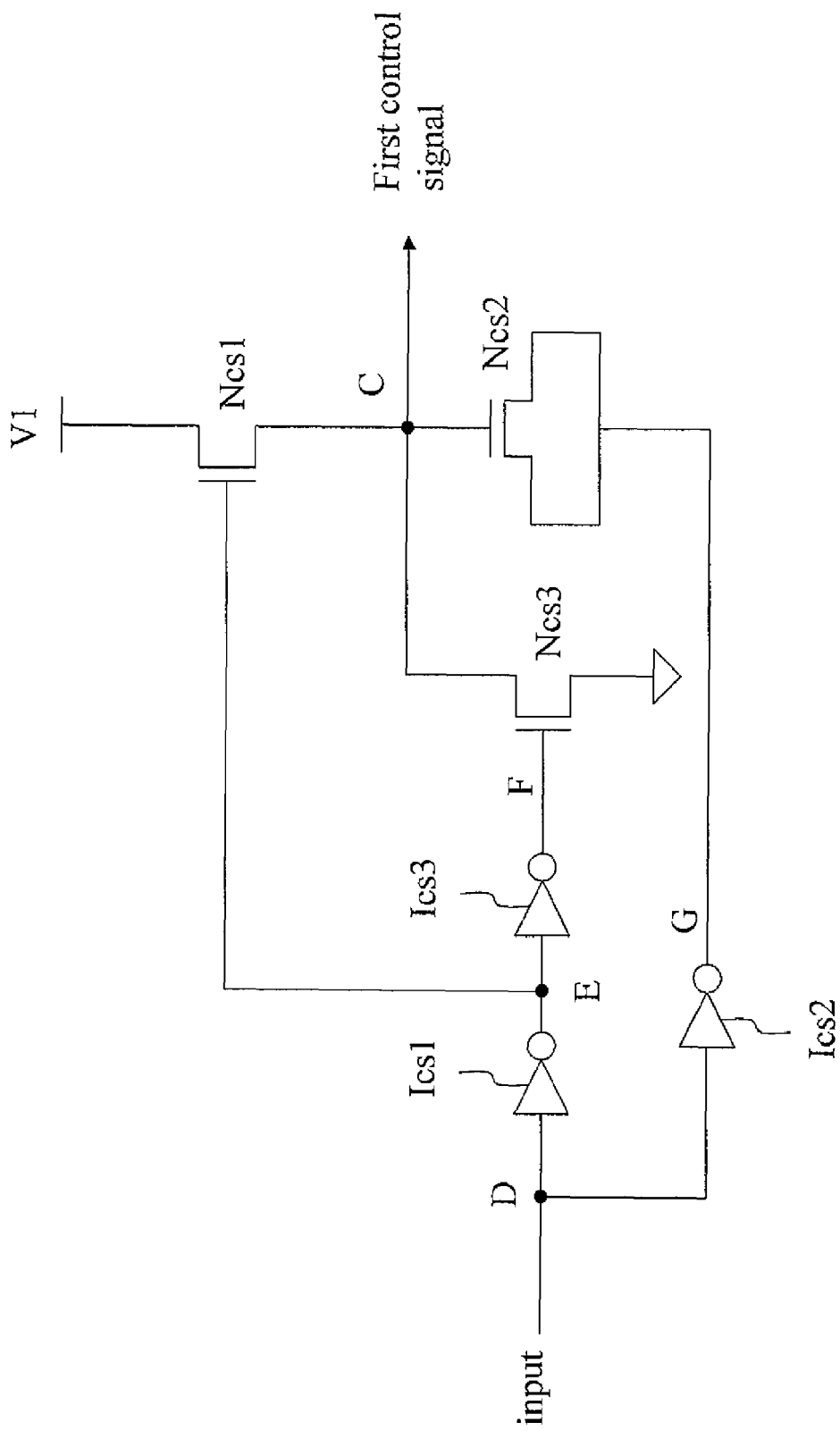
FIG. 6 is a schematic diagram of an embodiment of the control signal generating circuit shown in FIG. 5.

As shown in FIG. 5, the first control signal of the voltage level Vcs1 and the second control signal of the voltage level Vcs2 (not shown) can be generated by the control signal generating circuit 530. FIG. 6 shows an embodiment of the control signal generating circuit 530, which comprises the NMOS transistors Ncs1, Ncs2, and Ncs3 as well as the inverters Ics1, Ics2, and Ics3. The drain of the NMOS transistor Ncs1 is connected to a power supply of the first voltage level V1. The gate of the NMOS transistor Ncs1 receives the inversed input signal through the inverter Ics1. The source of the NMOS transistor Ncs1 is connected to the drain of the NMOS transistor Ncs3, and the gate of the NMOS transistor Ncs2 at the node C. The first control signal is outputted from the node C. The source and the drain of the NMOS transistor Ncs2 are connected together to receive the inversed input signal through the inverter Ics2. The NMOS transistor Ncs2 functions as a capacitor to provide the coupling voltage level Vx. The gate of the NMOS transistor Ncs3 receives the input signal through the inverters Ics1 and Ics3. The source of the NMOS transistor Ncs3 is connected to a power supply of the third voltage level Vss, such as the ground. The voltage of the first control signal is quickly pulled up to Vcs1=V1−Vth(Ncs1)+Vx. The voltage Vx may be implemented to be higher than Vth(Ncs1), the threshold voltage of the NMOS transistor Ncs1, so that the voltage of the first control signal Vcs1 is higher than the first voltage V1. More precisely, in order to expeditiously drive up the voltage of the node B, the voltage of the first control signal Vcs1 minus the threshold voltage of the third NMOS transistors N3, Vth(N3), has to be higher than the second voltage V2 minus the threshold voltage of the second PMOS transistor P2, Vth(P2). In other words, Vcs1−Vth(N3)≧V2−Vth(P2). Only the sufficiently high voltage of the control signal can render the driving capability of the auxiliary pull-up transistor to be stronger than that of the second PMOS transistor P2 so as to significantly reduce the time delay and current leakage.

Moreover, another NMOS transistor N9 may be added between V2 and node A. The gate of the NMOS transistor N9 is connected to an inverse of the first control signal.

In one embodiment of the level shifter used in a NAND flash, the first voltage V1 is about 2.5V (the Vcc of the circuit); the second voltage V2 is pulled from about 2.5V to about 20V during programming; the threshold voltage Vth (P2) of the second PMOS transistor P2 is about 2V; the threshold voltage Vth(N3) of the third NMOS transistor N3 is about 0.7V. In one embodiment of the control signal generating circuit, the first voltage V1 is 2.5V; the threshold voltage Vth(Ncs1) of the NMOS transistor Ncs1 is about 0.7V and; the voltage enhancement Vx is about 1.7V. Thus, the voltage of the first control signal Vcs1 is 3.5V, which is higher than 2.5V, the first voltage V1.

In the control signal generating circuit shown in FIG. 6, the inverter Ics1 is a normal one but both the inverters Ics2 and Ics3 have the output characteristics with going high slowly and going low quickly. This characteristic is caused by a weak PMOS and a strong NMOS in the inverter. When the input level is switched from the logic high to the logic low, the output of the inverter Ics1 switches from the logic low to the logic high quickly. The output of the inverter Ics3 also switches from the logic high to the logic low quickly. Therefore, in the first phase the NMOS transistor Ncs3 is rapidly turned off and the NMOS transistor Ncs1 is rapidly turned on to pull up the voltage of the first control signal at the node C to the voltage level of V1−Vth(Ncs1). And then, at the second phase the output of the inverter Ics2 goes high to boost the voltage of the first control signal at the node C to reach the voltage level Vcs1=V1−Vth(Ncs1)+Vx.

Figure 10:
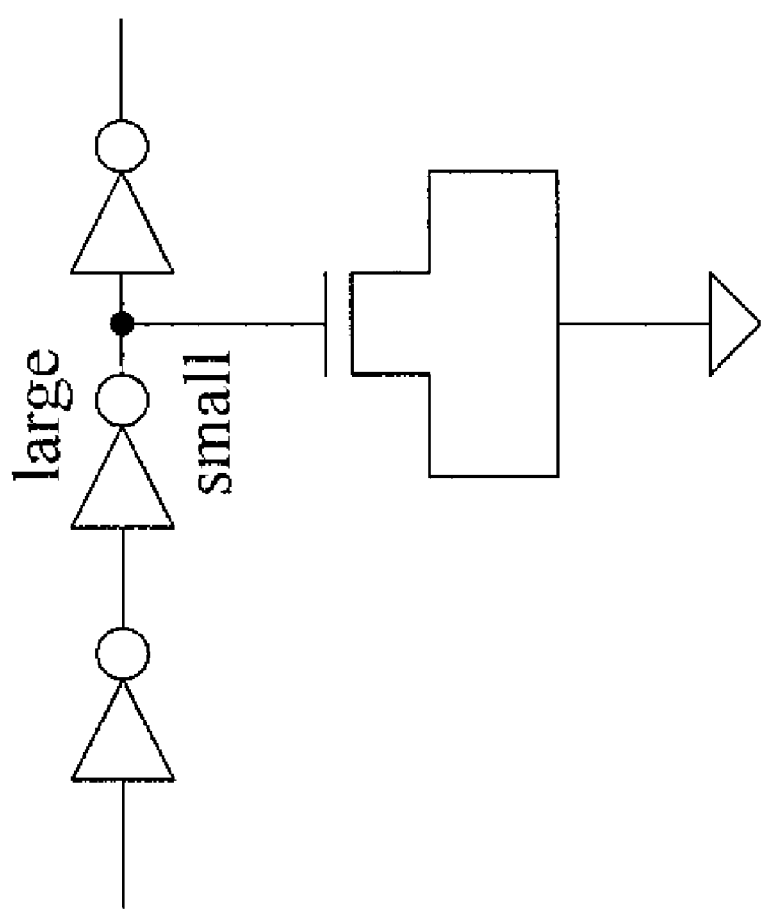
FIG. 10 is a schematic diagram of an embodiment of the second inverter and the third inverter shown in FIG. 6.

Each of the inverters Ics2 and Ics3 can be replaced by three inverters connected in series and an NMOS transistor as shown in FIG. 10. The inverter Ics2 can be replaced by a fourth inverter, a fifth inverter, a sixth inverter, and an NMOS transistor Ncs4. The fourth inverter, the fifth inverter, and the sixth inverter are connected in series. Among them, the fifth inverter is characterized to pull up fast and pull down slowly. A gate of the NMOS transistor Ncs4 is connected to an output of the fifth inverter. A source and a drain of the NMOS transistor Ncs4 are connected to a third voltage Vss, such as the ground. The inverter Ics3 can be replaced by a seventh inverter, a eighth inverter, a ninth inverter, and an NMOS transistor Ncs5. The seventh inverter, the eighth inverter, and the ninth inverter are connected in series. Among them, the eighth inverter is characterized to pull up fast and pull down slowly. A gate of the NMOS transistor Ncs5 is connected to an output of the eighth inverter. A source and a drain of the NMOS transistor Ncs5 are connected to a third voltage Vss, such as the ground.

Figure 7:
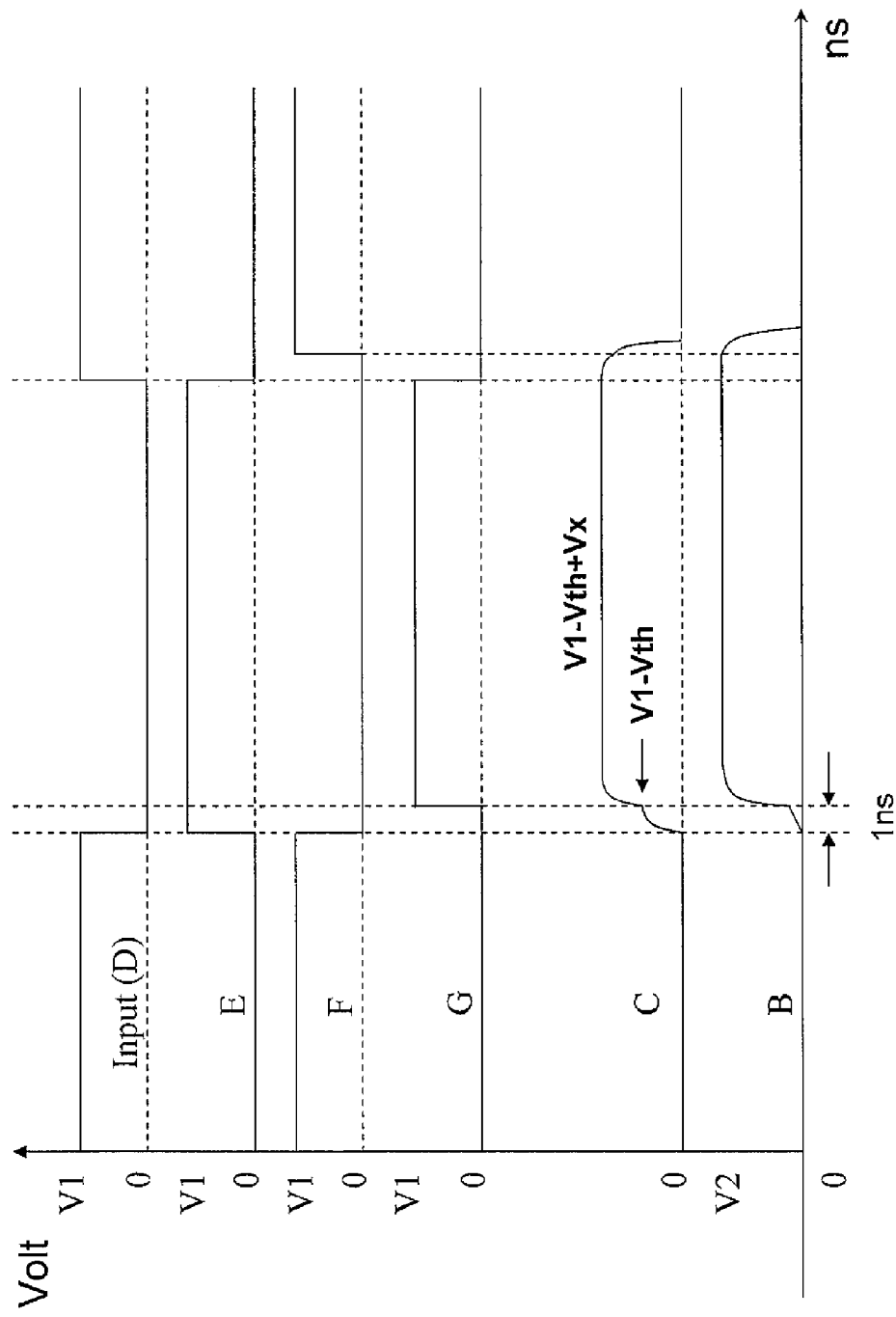
FIG. 7 is a waveform diagram of the level shifter circuit shown in FIG. 5.

FIG. 7 is the waveform of the level shifter circuit shown in FIG. 5 and the control signal generating circuit shown in FIG. 6. After the input signal is switched from the logic high of the first voltage V1 to the logic low of the ground voltage, it takes only within 1 ns for the voltage of the output signal to reach the second voltage level V2. Due to the sufficiently high voltage of the control signal at the node C, the time delay and current leakage are significantly reduced.

Figure 8:
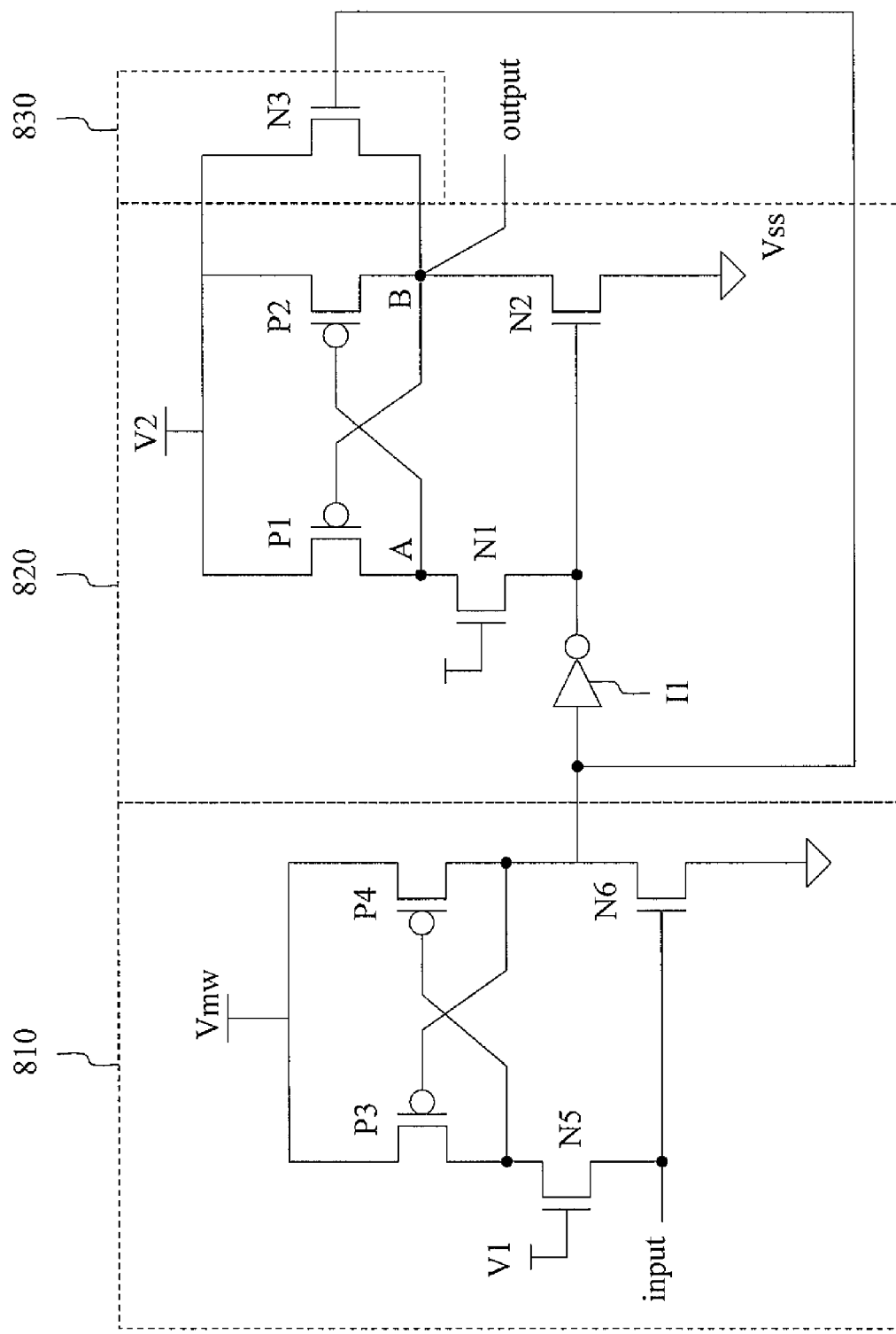
FIG. 8 is a schematic diagram of an embodiment of the inventive level shifter circuit with a two-stage voltage conversion.

In FIG. 8, an embodiment of the level shifter circuit includes a first-stage voltage converting circuit 810, a second-stage voltage converting circuit 820, and a voltage pull-up circuit 830. The first-stage voltage converting circuit 810 receives an input signal of the first voltage level V1 and outputs a midway signal of an intermediate voltage level Vmw. The second-stage voltage converting circuit 820 receives the midway signal and outputs an output signal of the second voltage level V2. The voltage pull-up circuit 830 has a first auxiliary pull-up transistor, the NMOS transistor N3, to receive, through its gate, the midway signal of the voltage Vmw as a control signal to expeditiously pull-up the voltage of the node B to the voltage level V2. In one embodiment, to expeditiously drive up the voltage of the node B, the intermediate voltage Vmw may be implemented to be about 3.5V, which is higher than the first voltage level V1, about 2.5V. In addition, the midway signal is in the opposite logic-level of the input signal. As a result, the time delay and current leakage can be substantially reduced.

The first-stage voltage converting circuit 810 has a third pull-up transistor, the third PMOS transistor P3; a fourth pull-up transistor, the fourth PMOS transistor P4; a third pull-down transistor, the fifth NMOS transistor N5; and a fourth pull-down transistor, the sixth NMOS transistor N6. The sources of the third PMOS transistor P3 and the fourth PMOS transistor P4 are connected to a power supply of voltage level Vmw. The first-stage voltage converting circuit outputs a midway signal of an intermediate voltage level Vmw, which is in the opposite logic-level of the input signal. Besides, the first-stage voltage converting circuit 810 as shown in FIG. 8 operates similarly to the voltage converting circuit 510 as shown in FIG. 5.

The second-stage voltage converting circuit has a first pull-up transistor, the first PMOS transistor P1; a second pull-up transistor, the second PMOS transistor P2; a first pull-down transistor, the first NMOS transistor N1; a second pull-down transistor, the second NMOS transistor N2; and an inverter I1 powered with the intermediate voltage Vmw. The midway signal is inversed through the inverter I1. The inversed midway signal is then provided to the source of the first NMOS transistor N1 and the gate of the second NMOS transistor N2. Besides, the second-stage voltage converting circuit 820 as shown in FIG. 8 operates similarly to the voltage converting circuit 510 as shown in FIG. 5.

Figure 9:
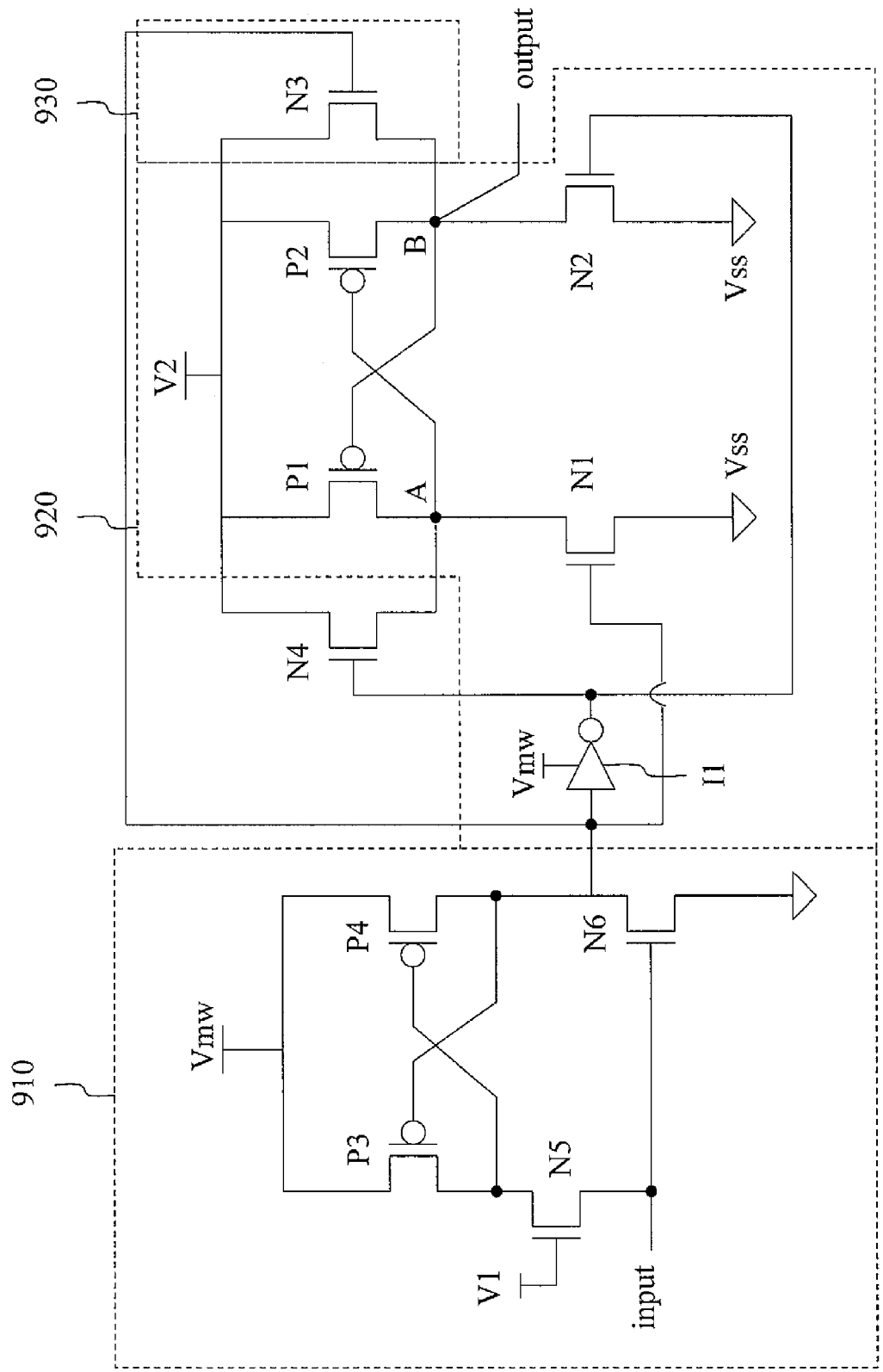
FIG. 9 is a schematic diagram of another embodiment of the inventive level shifter circuit with a two-stage voltage conversion.

In FIG. 9, another embodiment of the level shifter circuit includes the a first-stage voltage converting circuit 910, a second-stage voltage converting circuit 920, and a voltage pull-up circuit 930. The first-stage voltage converting circuit 910 receives an input signal of the first voltage level V1 and outputs a midway signal of an intermediate voltage level Vmw. The second-stage voltage converting circuit 920 receives the midway signal and outputs an output signal of the second voltage level V2. The voltage pull-up circuit 930 has a first auxiliary pull-up transistor, the NMOS transistor N3 and a second auxiliary pull-up transistor, the NMOS transistor N4. The gate of the NMOS transistor N3 receives the midway signal of the voltage Vmw as a control signal to expeditiously pull-up the voltage of the node B to the voltage level V2. In one embodiment, to expeditiously drive up the voltage of the node B, the intermediate voltage Vmw may be implemented to be about 3.5V, which is higher than the first voltage level V1, about 2.5V. In addition, the intermediate voltage Vmw is in the opposite logic-level of the input signal. The gate of the NMOS transistor N4 receives the inversed midway signal as the control signal to expeditiously pull-up the voltage of the node A to the voltage level V2. As a result, the time delay and current leakage can be substantially reduced.

The first-stage voltage converting circuit 910 shown in FIG. 9 operates in the same way as the first-stage voltage converting circuit 810 shown in FIG. 8. The second-stage voltage converting circuit 920 has a first pull-up transistor, the first PMOS transistor P1; a second pull-up transistor, the second PMOS transistor P2; a first pull-down transistor, the first NMOS transistor N1; a second pull-down transistor, the second NMOS transistor N2; and an inverter I1 powered with the intermediate voltage Vmw. The sources of the first NMOS transistor N1 and the second NMOS transistor N2 are connected to a power supply of the third voltage Vss, such as the ground. The gate of the first NMOS transistor N1 receives the midway signal. The midway signal is inversed by the inverter I1. The gate of the second NMOS transistor N2 receives the inversed midway signal. Besides, the second-stage voltage converting circuit 920 as shown in FIG. 9 operates similarly to the second-stage voltage converting circuit 820 as shown in FIG. 8. The waveform of the level shifter circuits shown in FIGS. 8 and 9 is similar to the waveform shown in FIG. 7, generated by the level shifter circuit show in FIG. 5.

Although the invention has been described in terms of exemplary embodiments, it is not limited thereto. The described embodiment is to be considered in all respects only as illustrative and not as restrictive. The present invention may be embodied in other specific forms without departing from its essential characteristics. The scope of the invention, therefore, is indicated by the appended claims rather than by the foregoing description. All changes, which come within the meaning and range of the equivalents of the claims, are to be embraced within their scope.

I claim:

1. A level shifter comprising:
    a voltage converting circuit configured to receive an input signal of a first voltage level and to output an output signal of a second voltage level;
    a voltage pull-up circuit coupled to the voltage converting circuit, configured to expeditiously pull up a voltage of an output node of the level shifter to the second voltage level in response to a control signal; and
    a control signal generating circuit, configured to receive the input signal and to provide the control signal to the voltage pull-up circuit, the control signal generating circuit including three transistors, and the control signal generating circuit having a voltage-boosting function and includes a capacitive element.

2. The level shifter of claim 1 wherein the voltage converting circuit comprises a first pull-up transistor,
    a second pull-up transistor, a first pull-down transistor, and
    a second pull-down transistor; first terminals of the first pull-up transistor and the second pull-up transistor are connected to a power supply of the second voltage level;
    a second terminal of the first pull-up transistor is connected to a first terminal of the first pull-down transistor at a first node;
    a second terminal of the second pull-up transistor is connected to a first terminal of the second pull-down transistor at a second node which is the output node of the level shifter;
    a third terminal of the first pull-up transistor is connected to the second node;
    and a third, terminal of the second pull-up transistor is connected to the first node.

3. The level shifter of claim 2, wherein second terminals of the first pull-down transistor and the second pull-down transistor are, connected to a third voltage,
    the third terminal of the first pull-down transistor is connected to receive an inverse of the input signal,
    the third terminal of the second pull-down transistor is connected to receive the input signal.

4. The level shifter of claim 2, wherein the second terminal of the second pull-down transistor is connected to a third voltage,
    the second terminal of the first pull-down transistor and the third terminal of the second pull-down transistor are connected to the input signal, and
    the third terminal of the first pull-down transistor is connected to a voltage which constantly turns on the first pull-down transistor.

5. The level shifter of claim 2, wherein the first pull-up transistor is a p-type transistor,
    the second pull-up transistor is a p-type transistor,
    the first pull-down transistor is an n-type transistor, and
    the second pull-down transistor is an n-type transistor.

6. The level shifter of claim 2, wherein the voltage pull-up circuit comprises a first auxiliary pull-up transistor connected between the power supply of the second voltage level and the second node,
    the first auxiliary pull-up transistor is an n-type transistor having a gate to receive the control signal.

7. The level shifter of claim 1, wherein the control signal has a voltage higher than the first voltage level.

8. The level shifter of claim 1, wherein the three transistors in the control signal generating circuit are a first n-type transistor,
    a second n-type transistor, and a third n-type transistor.

9. The level shifter of claim 6,
    A level shifter comprising:
    a voltage converting circuit configured to receive an input signal of a first voltage level and to output an output signal of a second voltage level;
    a voltage pull-up circuit coupled to the voltage converting circuit, configured to expeditiously pull up a voltage of an output node of the level shifter to the second voltage level in response to a control signal; and
    a control signal generating circuit, configured to receive the input signal and to provide the control signal to the voltage pull-up circuit, the control signal generating circuit including three transistors;
    wherein the voltage converting circuit comprises a first pull-up transistor,
    a second pull-up transistor, a first pull-down transistor, and
    a second pull-down transistor; first terminals of the first pull-up transistor and the second pull-up transistor are connected to a power supply of the second voltage level;
    a second terminal of the first pull-up transistor is connected to a first terminal of the first pull-down transistor at a first node;
    a second terminal of the second pull-up transistor is connected to a first terminal of the second pull-down transistor at a second node which is the output node of the level shifter;
    wherein the voltage pull-up circuit comprises a first auxiliary pull-up transistor connected between the power supply of the second voltage level and the second node,
    the first auxiliary pull-up transistor is an n-type transistor having a gate to receive the control signal; and
    wherein the voltage pull-up circuit comprises a second auxiliary pull-up transistor connected between the power supply of the second voltage level and the first node, the second auxiliary pull-up transistor is an n-type transistor having a gate to receive an inverse of the control signal.

10. The level shifter of claim 8,

A level shifter comprising:
a voltage converting circuit configured to receive an input signal of a first voltage level and to output an output signal of a second voltage level;
a voltage pull-up circuit coupled to the voltage converting circuit, configured to expeditiously pull up a voltage of an output node of the level shifter to the second voltage level in response to a control signal; and
a control signal generating circuit, configured to receive the input signal and to provide the control signal to the voltage pull-up circuit, the control signal generating circuit including three transistors;
wherein the three transistors in the control signal generating circuit are a first n-type transistor,
a second n-type transistor, and a third n-type transistor; and
wherein a drain of the first n-type transistor is connected to the power supply of the first voltage level,
a gate of the first n-type transistor receives a first signal, a source of the first n-type transistor is connected to a gate of the first auxiliary pull-up transistor,
a gate of the second n-type transistor, and a drain of the third n-type transistor; a source and a drain of the second n-type transistor are connected to each other and receive a second signal;
a gate of the third n-type transistor receives a third signal, a source of the third n-type transistor is connected to a third voltage.

11. The level shifter of claim 10, further comprising a first inverter,
a second inverter, and a third inverter;
the first inverter receives the input signal to generate the first signal;
the second inverter receives the input signal to generate the second signal;
the third inverter receives the first signal to generate the third signal.

12. The level shifter of claim 11, wherein the second inverter and the third inverter are characterized to pull up slowly and pull down fast.

13. The level shifter of claim 11, wherein the second inverter comprises a fourth inverter,
a fifth inverter,
a sixth inverter, and a fourth n-type transistor; the fourth inverter, the fifth inverter, and the sixth inverter are connected in series;
the fifth inverter is characterized to pull up fast and pull down slowly;
a gate of the fourth n-type transistor is connected to an output of the fifth inverter; a source and a drain of the fourth n-type transistor are connected to a third voltage.

14. The level shifter of claim 11, wherein the third inverter comprises a seventh inverter, an eighth inverter,
a ninth inverter, and a fifth n-type transistor;
the seventh inverter, the eighth inverter, and the ninth inverter are connected in series;
the eighth inverter is characterized to pull up fast and pull down slowly;
a gate of the fifth n-type transistor is connected to an output of the eighth inverter; a source and a drain of the fifth n-type transistor are connected to a third voltage.

* * * * *